(12) United States Patent
Chang et al.

(10) Patent No.: US 7,564,556 B2
(45) Date of Patent: Jul. 21, 2009

(54) METHOD AND APPARATUS FOR LENS CONTAMINATION CONTROL

(75) Inventors: Keh-Wen Chang, Miaoli County (TW); Jun-Ren Chen, Jhubei (TW)

(73) Assignee: Taiwan Semiconductor Manufacturing Company, Hsin-Chu (TW)

(\*) Notice: Subject to any disclaimer, the term of this patent is extended or adjusted under 35 U.S.C. 154(b) by 168 days.

(21) Appl. No.: 11/695,166

(22) Filed: Apr. 2, 2007

(65) Prior Publication Data

US 2008/0241714 A1  Oct. 2, 2008

(51) Int. Cl.
*G01B 11/00* (2006.01)
*G01B 9/00* (2006.01)
*G01N 21/00* (2006.01)
*G03B 27/32* (2006.01)
*G03F 9/00* (2006.01)

(52) U.S. Cl. ............. 356/401; 356/124; 356/239.2; 355/77; 430/22

(58) Field of Classification Search ............ None
See application file for complete search history.

(56) References Cited

U.S. PATENT DOCUMENTS

| | | | | |
|---|---|---|---|---|
| 5,087,537 A | * | 2/1992 | Conway et al. | 430/15 |
| 5,438,405 A | * | 8/1995 | Lapidot et al. | 356/239.2 |
| 5,674,650 A | | 10/1997 | Dirksen et al. | |
| 5,888,675 A | * | 3/1999 | Moore et al. | 430/5 |
| 6,480,260 B1 | | 11/2002 | Donders et al. | |
| 6,806,456 B1 | * | 10/2004 | Ye et al. | 250/208.1 |
| 6,835,507 B2 | * | 12/2004 | Ki et al. | 430/5 |
| 6,842,237 B2 | * | 1/2005 | Ausschnitt et al. | 356/124 |
| 6,862,076 B2 | * | 3/2005 | Mulder et al. | 355/40 |
| 6,897,947 B1 | | 5/2005 | van der Laan et al. | |
| 7,096,127 B2 | * | 8/2006 | Ziger et al. | 702/32 |

FOREIGN PATENT DOCUMENTS

TW  442892  6/2001

OTHER PUBLICATIONS

H. W. Van Zeijl et al., "Lithographic Alignment Offset Compensation for Substrate Transfer Processes," Sep. 26, 2005, pp. 121-126.

\* cited by examiner

*Primary Examiner*—Gregory J Toatley, Jr.
*Assistant Examiner*—Gordon J Stock, Jr.
(74) *Attorney, Agent, or Firm*—Haynes and Boone, LLP (57) ABSTRACT

The present disclosure provides a method for measuring lens contamination in a lithography apparatus. The method includes imaging an asymmetric pattern utilizing a lens system and measuring an alignment offset of the asymmetric pattern associated with the lens system. A contamination of the lens system is determined by comparing the alignment offset to a reference value.

19 Claims, 8 Drawing Sheets

METHOD AND APPARATUS FOR LENS CONTAMINATION CONTROL

BACKGROUND

Semiconductor integrated circuit (IC) technology is continually progressing to circuit layouts having smaller feature sizes as well as increased density. As a result of this continuous progression, photolithography systems are utilizing shorter wavelength light such as extreme ultraviolet (EUV) in order for enhanced resolution. These enhanced resolution systems typically require a high power optical source. High power optical sources may cause some reactions on the lens of the lithography system and can introduce various defects including particles, contaminations, and other types of damage.

It is desired, therefore, to provide a method and apparatus for monitoring lens contamination. It is also desired that the method and/or apparatus be cost effective.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
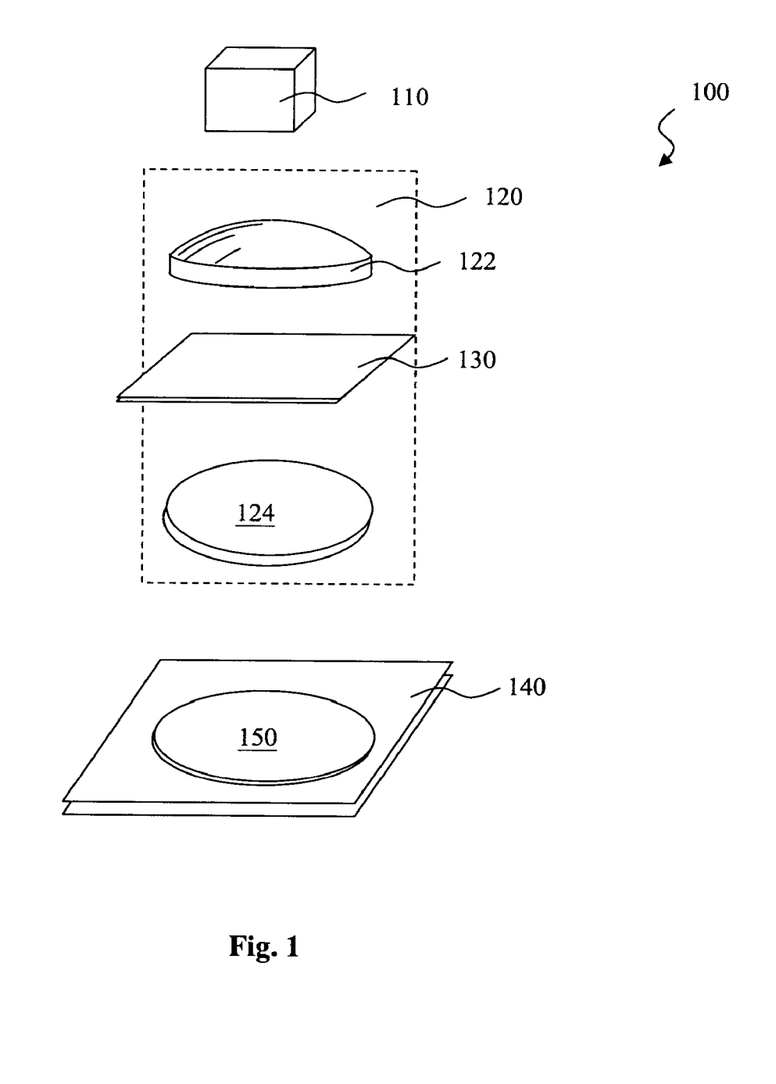
FIG. 1 is a schematic view of one embodiment of a lithography apparatus constructed according to aspects of the present disclosure.
Figure 2:
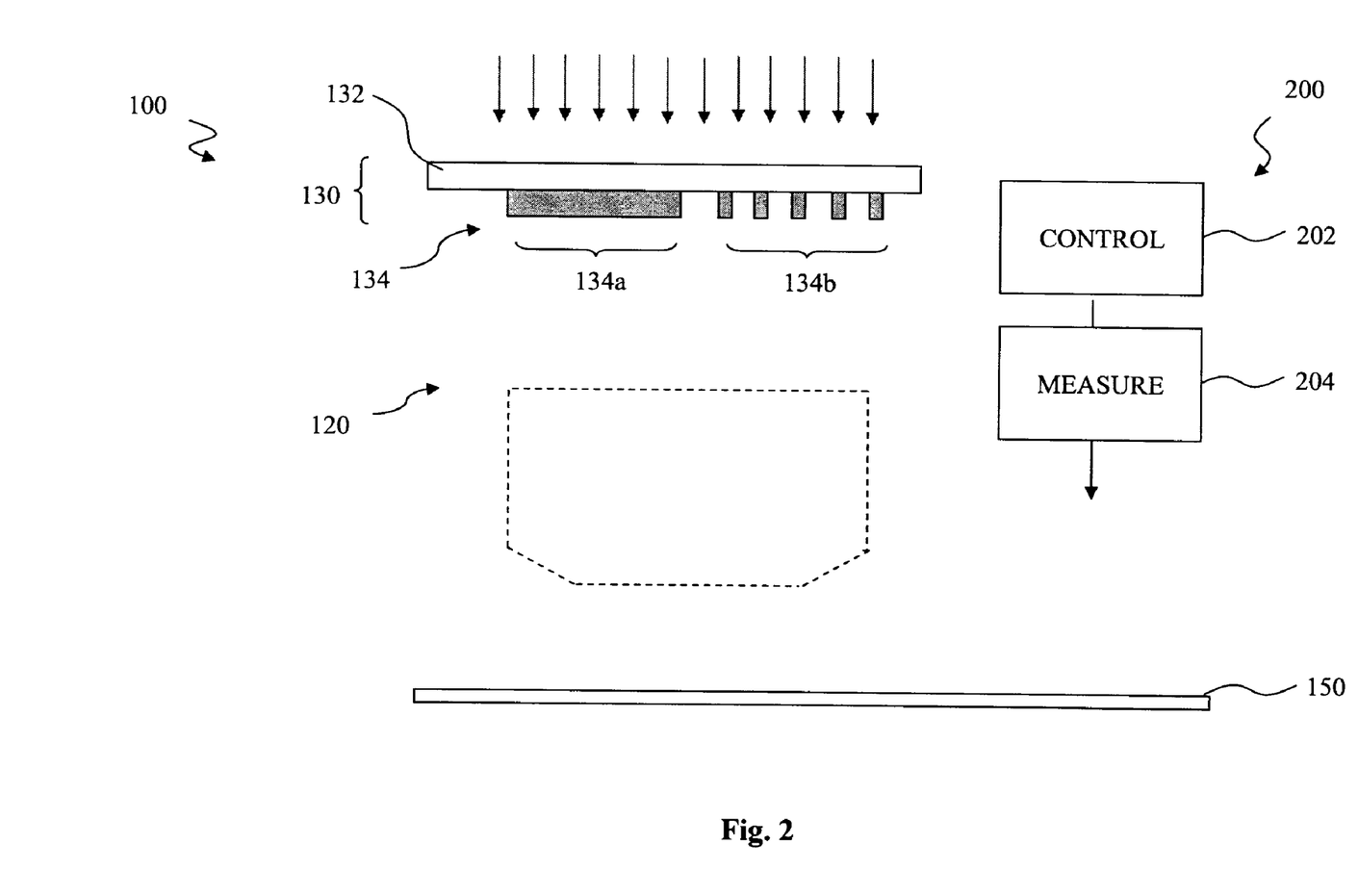
FIG. 2 is a schematic view of a lithography apparatus, such as the apparatus of FIG. 1, with a mask having an asymmetric pattern configured according to aspects of the present disclosure.

Referring to FIGS. 1 and 2, a lithography apparatus 100 is one example of a system that can benefit from various embodiments or aspects of the present invention. For the sake of further example, the lithography apparatus 100 has multiple substrate stages and multiple lens systems, as discussed in greater detail below.

The lithography apparatus 100 includes a radiation source 110 to provide radiation beams (radiation energy). The radiation source 110 may be a suitable light source such as an ultra-violet (UV), deep ultra-violet (DUV), or extreme ultra-violet (EUV) source. For example, the radiation source 110 may be, but not limited to, a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm.

The lithography apparatus 100 includes a lens system 120 to project radiation energy for lithography patterning. The lens system 120 further includes an illumination module (e.g., a condenser) 122 having a single lens, or multiple lenses and other lens components. In one or more embodiments, the illumination module 122 may include microlens arrays, shadow masks, or other structures designed to aid in directing radiation beams from the radiation source 110 onto a photomask (also referred to as a "mask" or "reticle").

The lens system 120 also includes an imaging lens module 124. The imaging lens module 124 may have a single lens or a plurality of lens elements configured to project the radiation beam onto a substrate.

In the present embodiment, a mask 130 is used in the lithography apparatus 100 during a lithography process. The mask 130 may include a transparent substrate and an absorption layer. The transparent substrate may use fused silica ($SiO_2$), borosilicate glass, or soda-lime glass. The absorption layer may be formed using a plurality of processes and materials, such as depositing a metal film made with chromium (Cr), iron oxide, or an inorganic film made with MoSi, ZrSiO, SiN, and/or TiN. The absorption layer may be patterned to have one or more openings where radiation beams may travel through without being absorbed and have one or more absorption areas where the radiation beams may be completely or partially blocked thereby. In one example, the mask may include a binary intensity mask (BIM or binary mask) including chrome areas and transparent quartz areas. The mask may alternatively or additionally include various optical proximity correction (OPC) features. In another example, the mask 130 may be an alternating phase shift mask (AltPSM), employing alternating areas of chrome and 180 degree-shifted quartz. In another example, the mask 130 may be an attenuating phase shift mask (AttPSM), employing an attenuating material such as MoSi with 80 degree phase shift and transparent quartz. Alternatively, the mask may include chromeless phase lithography (CPL) features. The mask 130 is operable to move in translational and rotational modes. The mask 130 also includes an asymmetric pattern configured according to aspects of the present disclosure, as further discussed below with reference to FIG. 3.

The lithography apparatus 100 may further include a mask stage (not shown) having a scan function. The mask stage is operable to secure the mask and manipulate the mask in transitional and/or rotational modes.

The lithography apparatus 100 includes a substrate stage 140 for holding and manipulating a substrate 150 to be patterned in transitional and/or rotational modes during a lithography patterning process. It is understood that the manipulation of the substrate 150 is considered relative to the mask 130, so that one or both of the mask 130 and stage 140 can move to achieve the desired manipulation. The substrate stage 140 may be designed to implement a step-and-scan process.

In the present embodiment, the substrate 150 is a wafer having silicon, germanium, diamond, or a compound semiconductor. The substrate 150 may alternatively include other materials such as glass for thin-film transistor liquid crystal display (TFT_LCD) devices or fused silicon/calcium fluoride for photomasks. The substrate 150 may include a plurality of layers formed thereon, each having patterned structures. The substrate 150 may include a material layer formed thereon and to be patterned. The substrate 150 is further coated with an imaging layer for lithography patterning process such as photoresist. An exemplary photoresist include chemical amplification resist (CAR).

The lithography apparatus 100 may include other functional modules such as an alignment device and/or a focus servo device capable of detecting alignment, and focusing using a non-developed image layer, respectively, such as those described in the U.S. Pat. No. 5,674,650 by Dirksen et al.

Referring specifically to FIG. 2, included with the lithography apparatus 100 is a detection system 200 for monitoring lens contamination and/or performing other functions, as needed. Some or all of the detection system 200 can be physically separate from the lithography apparatus, and can communicate accordingly through wireless or wired communication paths. In the present embodiment, the detection system 200 is in-situ, and thus can perform one or more of the functions without requiring the substrate 150 to be removed. The detection system 200 includes a control unit 202 and a measurement system 204. The control unit 202 includes a processor, memory, input/output, and instructions for performing various functions, such as a FOCAL technique discussed in greater detail below. The measurement system 204 includes additional optics and/or hardware to provide information used when performing the FOCAL technique.

Figure 3:
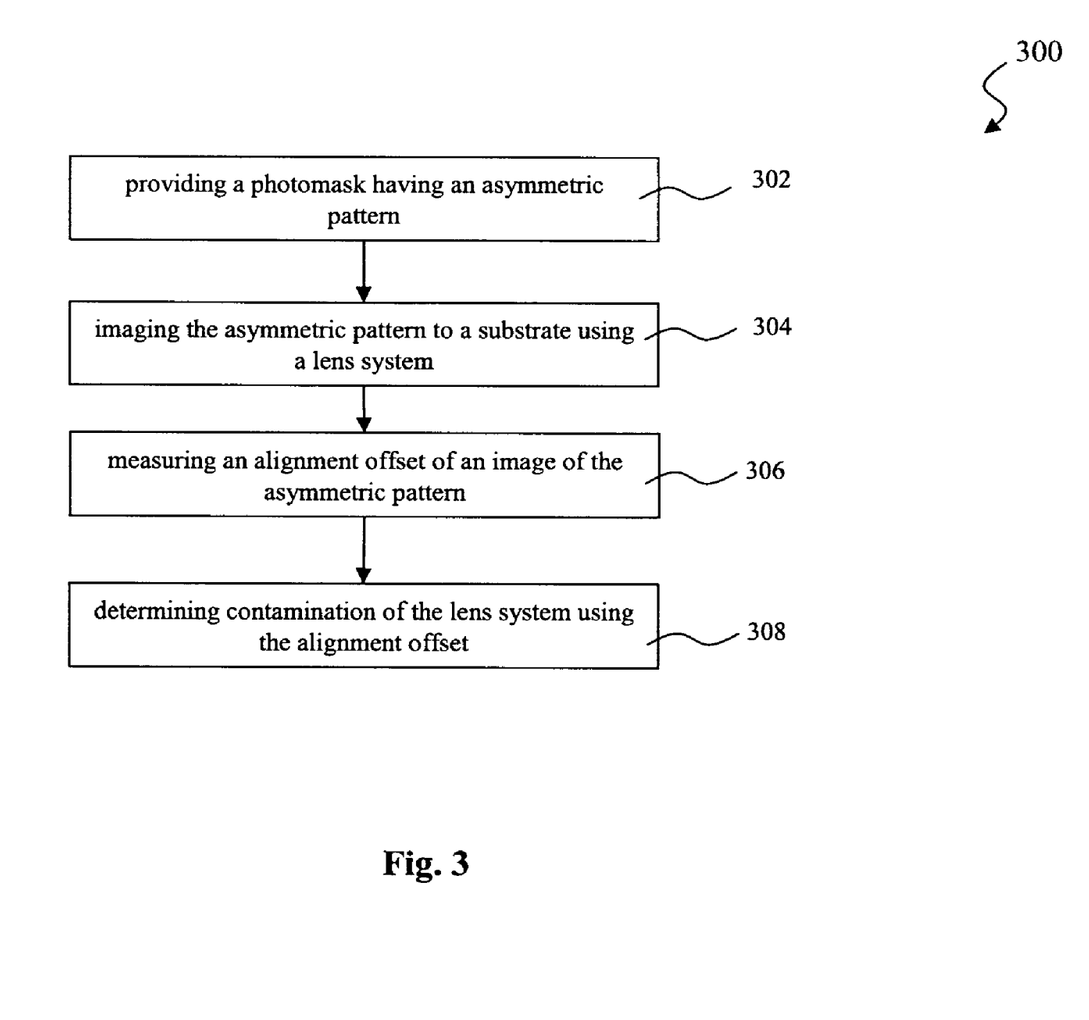
FIG. 3 is a flowchart of one embodiment of a method for monitoring lens contamination.

Referring also to FIG. 3, a method 300 can be used for monitoring lens contamination. For the sake of further example, the method 300 will be described as running on the detection system 200 for monitoring the lithography apparatus 100, and more specifically, contamination of the lens system 120.

The method 300 begins at step 302 by providing the mask 130 with an asymmetric pattern. The mask 130 is secured in and manipulated by the lithography apparatus 100. The mask 130 may be positioned between an optical source and the imaging lens module 124. The mask 130 includes a transparent substrate 132 and the asymmetric pattern 134 formed thereon. The asymmetric pattern 134 is designed for implementing the FOCAL technique in the lithography apparatus 100. The asymmetric pattern 134 can be formed as a binary intensity mask feature or other proper mask features such as a phase shift mask feature. The asymmetric pattern includes two portions in one embodiment. For example, the asymmetric pattern includes a first portion 134a and a second portion 134b, aligned together. Both portions may have a substantially similar outline but each includes a different sub-pattern, a different pattern density, and/or a different pattern orientation to make the combined pattern asymmetric. In one embodiment, the second portion 134b includes a plurality of opaque strips alternating with transparent strip.

Figure 4A:
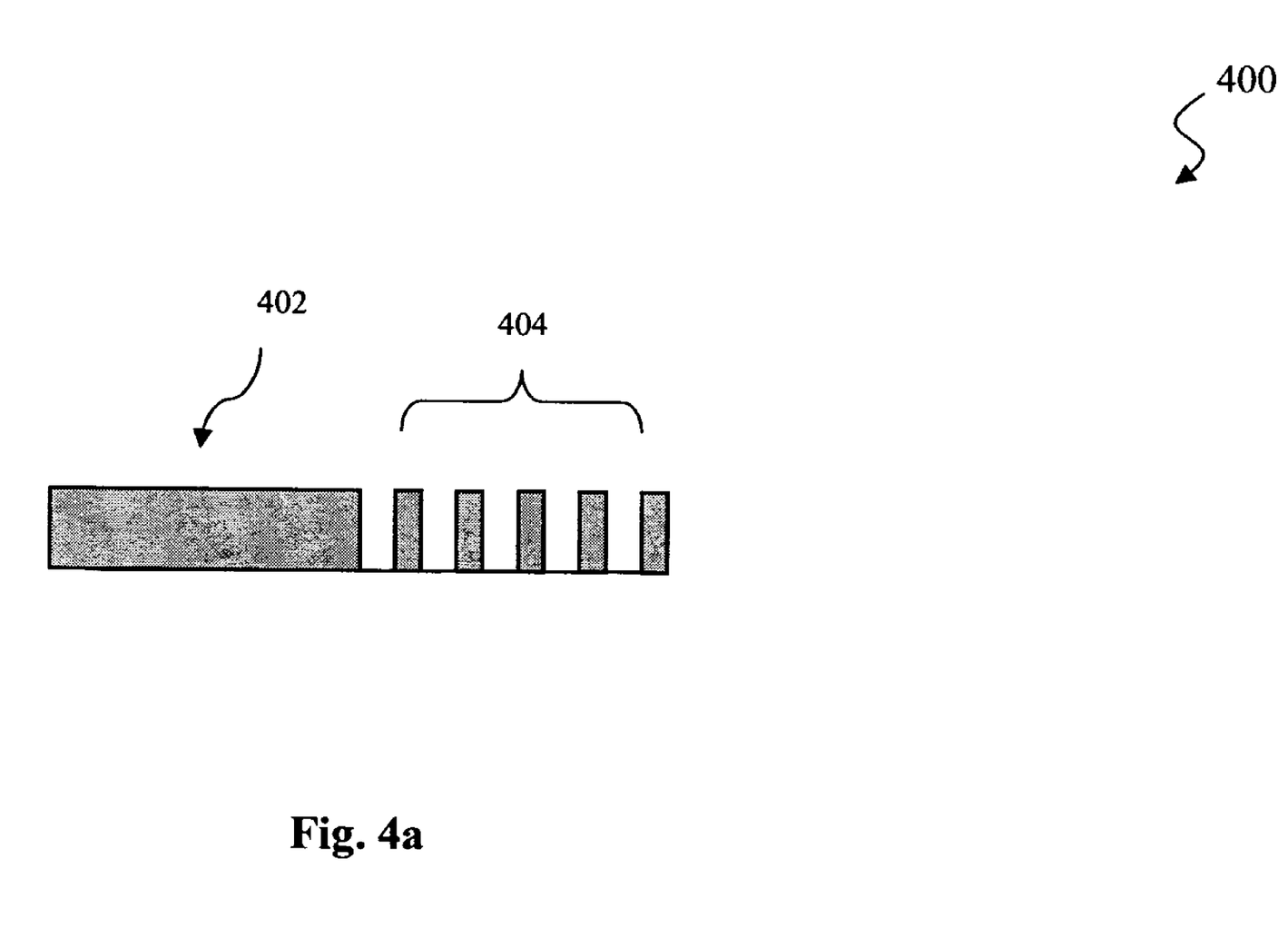
FIGS. 4a, 4b and 4c illustrate sectional views of various asymmetric patterns for use in a lithography apparatus according to one or more embodiments of the present disclosure.
Figure 4B:
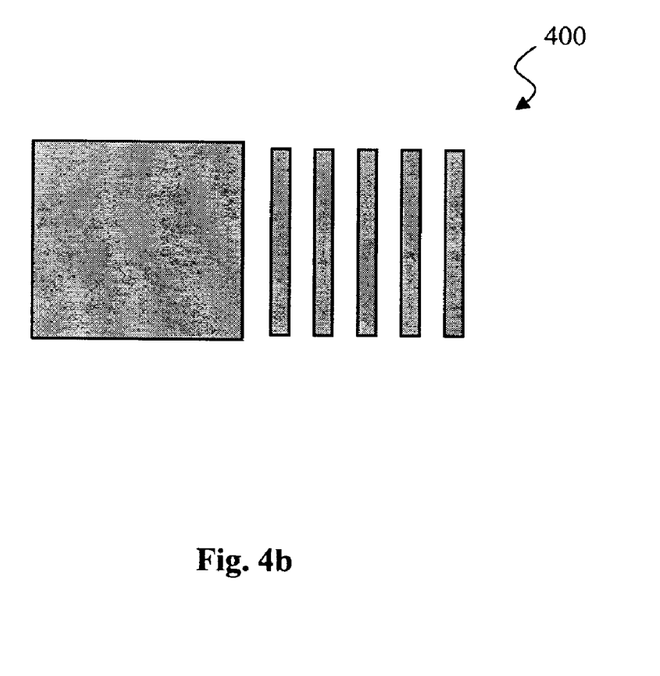
Figure 4C:
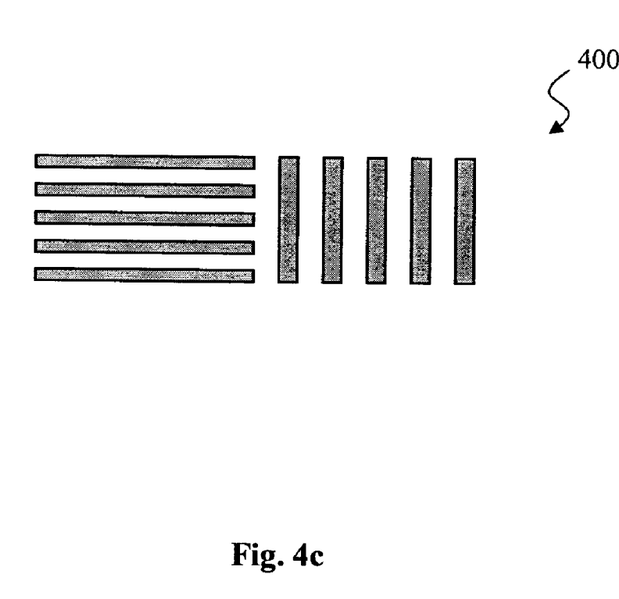
Figure 5A:
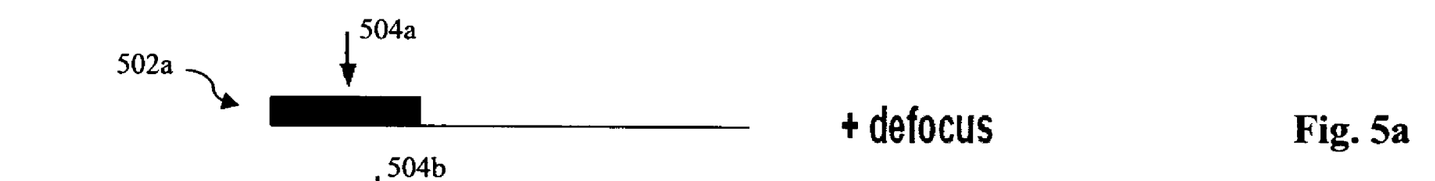
FIGS. 5a through 5e illustrate alignment methods for an asymmetric pattern at various focus conditions constructed according to aspects of the present disclosure.
Figure 5B:
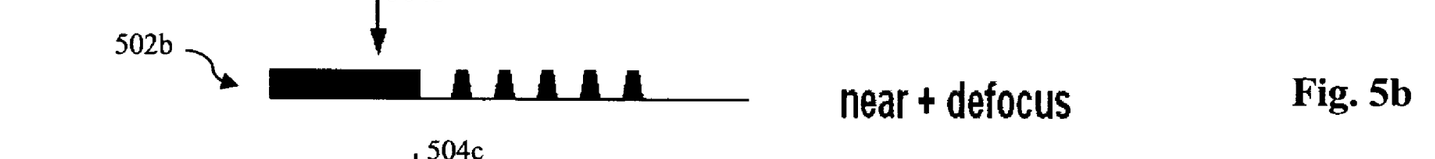
Figure 5C:
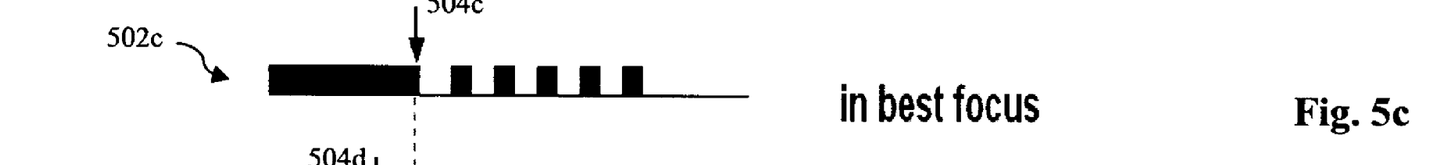
Figure 5D:
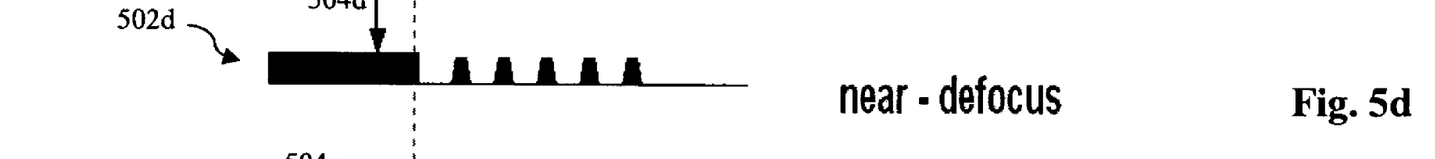
Figure 5E:
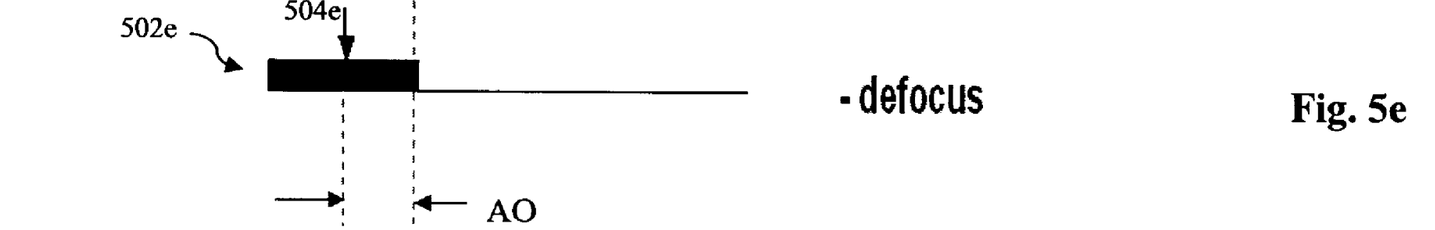

The FOCAL technique can be described by providing examples. FIGS. 4a, 4b, and 4c illustrate various examples of the asymmetric pattern 134. FIG. 4a presents one exemplary asymmetric pattern referred to herein by the numeral 400 with a first portion 402 and second portion 404 in side view while FIGS. 4b and 4c present two alternative exemplary asymmetric patterns 400 in top view, respectively. In other embodiments, the asymmetric pattern 132 may alternatively include various portions (such as two or more portions) designed, configured, and dimensioned such that the whole pattern is asymmetric. In another embodiment, the asymmetric pattern 134 can be a sub portion of a mark such as a test mark or alignment mark. In another embodiment, a test or alignment mark includes a plurality of such asymmetric patterns disposed in a proper configuration. The mask 130 may additionally include other predefined features such as integrated circuit (IC) patterns, various test patterns, monitoring features, and/or alignment features.

Still referring to FIGS. 2 and 3, the method 300 proceeds to step 304 by imaging the asymmetric pattern to a substrate using a lithography apparatus. An exemplary substrate 150, substantially similar to the substrate illustrated in FIG. 1 such as a semiconductor wafer, is positioned in the lithography apparatus 100 to be exposed by the lithography apparatus 100. The substrate 150 includes an imaging layer coated thereon. For example, the substrate 150 is positioned away from the mask such that the imaging lens module 124 is interposed there-between.

When imaging the asymmetric pattern 134 onto the substrate, an image of the asymmetric pattern is projected onto the imaging layer of the substrate 150 and formed thereon. The image of the asymmetric pattern on the imaging layer is further measured to identify an image center of the asymmetric pattern. For example, the image of the asymmetric pattern can be aligned to an alignment mark to identify the image center of the image of the asymmetric pattern on the image layer, which is identifiable by an optical system such as an alignment system or an optical microscope in various examples.

With additional reference to FIGS. 5a through 5e, the imaging lens module 124 can be moved along the optical axis of the imaging lens module relative to the mask 130 and the substrate 150 for various imaging effects. When the lithography apparatus is well adjusted to the best focus state, the asymmetric pattern can be fully formed on the imaging layer of the substrate, such as an image 502c illustrated in FIG. 5c. Therefore, an image center is identified at location 504c. When the lithography apparatus is out of focus, the second portion 134b of the asymmetric pattern 132 cannot be fully imaged to the imaging layer, such as the images 502b and 502d illustrated in FIGS. 5b and 5d, respectively. Therefore, a corresponding image center is identified at a different location such as 504b and 504d, respectively, which are shifted away from the image center 504c corresponding to the best focus. When the lithography apparatus is substantially out of focus, the second portion 134b of the asymmetric pattern 134 cannot be imaged and disappears, such as images 502a and 502e illustrated in FIGS. 5a and 5e, respectively. Therefore, the image center is identified at a different location such as 504a and 504e illustrated in FIGS. 5a and 5e, respectively. In the examples for the asymmetric pattern 134, the image center 504a and 504e is shifted away from the image center of the best focus and reach towards the center of the first portion 134a of the asymmetric pattern 134. When the imaging lens module moves along the optical axis, the lithography apparatus will go through various defocus, focus, and defocus states. The image center shifts to different locations accordingly at the various defocus states as illustrated in FIG. 6, which is also referred to as alignment offset.

Figure 6:
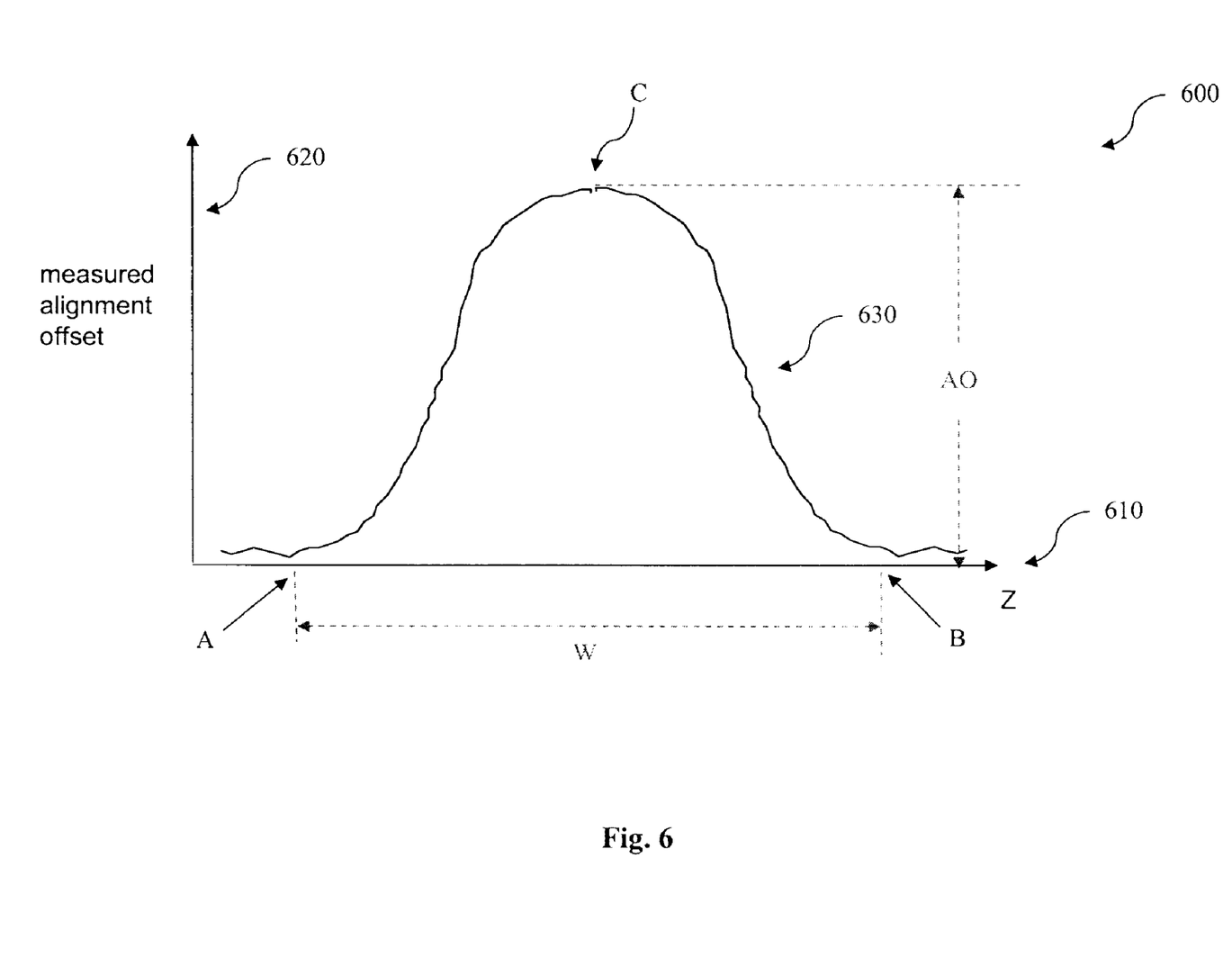
FIG. 6 is an exemplary graph of alignment offset versus focus conditions.

FIG. 6 illustrates a graph 600 of alignment offset versus focus conditions in one example. In the graph 600, a horizontal axis 610 represents focus displacement of the imaging lens module along the optical axis (z direction). A vertical axis 620 represents alignment offset. A curve 630 represents an exemplary alignment offset over various focus conditions. The best focus state corresponds to the maximum alignment offset. The maximum alignment offset is illustrated at FIG. 6, and also in FIGS. 5c through 5e. There is also a focus range "W" of the alignment offset on the horizontal axis, defined as from "A" where the alignment offset reaches zero (from the maximum alignment offset "C") to "B" where the alignment offset reaches zero (from the zero alignment offset "C"). The range "W" can be determined by the lithography apparatus, especially by the lens system.

Referring again to FIGS. 2 and 3, the method 300 proceeds to step 306 by measuring an alignment offset of an image of the asymmetric pattern. The alignment offset can be measured by various proper techniques to determine a best focus condition; this method is referred to as the FOCAL technique. In one example, the asymmetric pattern is projected on the image layer for exposure, further baked post exposure, and developed to form a pattern of an image of the asymmetric pattern from the image layer. The pattern of the image layer is then measured by an optical device such as an optical microscope to identify the center of the image of the asymmetric pattern on the imaging layer.

In another example, an image of the asymmetric pattern is formed on the image layer by exposure but without development and is detectable due to characteristic difference such as index of refraction difference. In furtherance of the embodiment, the image layer may be baked after the exposure to generate and/or enhance such characteristic difference. The image is then measured by a detector such as an alignment system. The alignment system can be integrated with the lithography apparatus for in-situ measurement and cost effectiveness.

Figure 7:
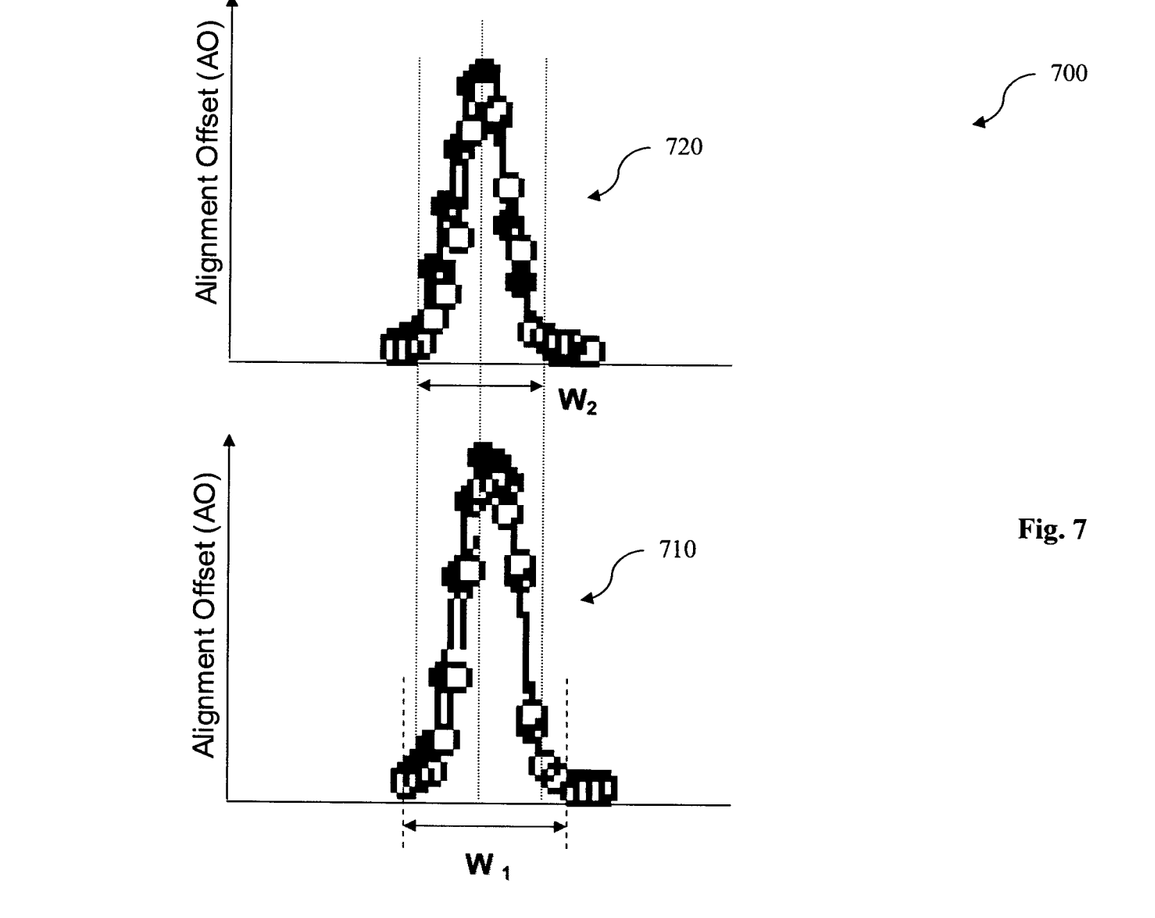
FIG. 7 illustrates various diagrams with regard to alignment offset in various conditions, according to aspects of the present disclosure.

Still referring to FIGS. 2 and 3, the method 300 proceeds to step 308 by determining the contamination of the lens system measuring an alignment offset of an image of the asymmetric pattern. The focus range "W" is determined by the imaging system including the lens system. When the lens system is contaminated, a portion of the projected light will be diffracted by the contamination, causing stray light and resulting in a fuzzy image, even at a best focus state. The focus range "W" will be narrower due to a contrast loss by the stray light. Accordingly, the maximum alignment offset (AO) is smaller than the standard AO due to the stray light. With additional reference to exemplary diagrams 700 in FIG. 7, the lithography apparatus may have a focus of W1 as illustrated by a curve 710 when the apparatus is not contaminated. However, when the lens system is contaminated, the focus range is narrowed to W2 as illustrated in a curve 720. The difference between W1 and W2 represents an amount of contamination. Therefore, using the focus range W1 as a reference, the contamination can be detected by the change of the focus range. Similarly, the contamination can be detected by the AO change.

The disclosed method to detect/monitor contamination has several advantages. For example, the disclosed method is capable of monitoring all ranges of stray light caused by contamination and/or other defects. For example, the above-described method is capable of monitoring large range stray light (e.g., more than about 200 micron), medium range (e.g., from about 200 micron to about 5 micron), and short range (e.g., less than about 5 micron). The method is also capable of monitoring contamination online without removing the imaged substrate from the lithography apparatus. The tool throughput is thereby increased and the manufacturing cost is reduced. The method can also be directly implemented on the lithography apparatus and combined with existing FOCAL techniques while checking for focus, without additional tool time and engineer effort. The software to control and implement the FOCAL technique can be modified to incorporate the disclosed method.

The present disclosure provides various embodiments of a lithography apparatus and a method to utilize the lithography apparatus. Other variations may also be possible within the scope of the invention. The method 300 may implement the processing steps in different sequences. For example, AO may be collected for a lithography apparatus in a separate process flow as the reference. The lithography apparatus further include software and algorithm to automatically implement the method 300 and alert the responsible engineer/operator for any contamination when a change of the AO is detected. Further, criteria may be predefined, if the change of the AO is equal to or larger than the predefined criteria, then a contamination alarm is sent out to alert the responsible engineer or operator. The lithography apparatus may use other radiation beams for imaging such as x-rays. The lithography apparatus can be a stepper or a scanner in some embodiments. The asymmetric pattern can be imaged in various fields of a substrate and various locations of each field. The focus range or AO may use a local standard value in the same location of the same field as a reference to check the change thereof and monitor the contamination. The method may implement a process to image the asymmetric pattern at a same area multiple times.

Thus, the present disclosure provides a method for measuring lens contamination in a lithography apparatus. The method includes imaging an asymmetric pattern utilizing a lens system; measuring an alignment offset of the asymmetric pattern and associated with the lens system; and determining defects of the lens system by comparing the alignment offset (AO) to a reference AO.

In the disclosed method, the imaging of the asymmetric pattern may include introducing stray light from the defects of the lens system, the stray light narrowing the alignment offset relative to the reference alignment offset thereby. The defects of the lens system may include such things as particles, chemical contamination, physical defects, and combinations thereof. The method may further include providing a mask having the asymmetric pattern. The imaging of the asymmetric pattern may include imaging the asymmetric pattern to a substrate coated with a photosensitive material layer. The method may further include imaging the asymmetric pattern utilizing a reference lens system that is substantially defect-free and measuring the reference AO of the asymmetric pattern. The method may further include implementing a focus calibration utilizing the asymmetric pattern.

The present disclosure also provides a method for measuring lens contamination in a lithography apparatus. The method includes providing a mask having an asymmetric pattern utilizable by a FOCAL technique; imaging the asymmetric pattern to a substrate using a lens system; measuring an alignment offset of the asymmetric pattern; and identifying and/or measuring defects of the lens system using the alignment offset.

In the present method, the imaging the asymmetric pattern may include imaging the asymmetric pattern to the substrate in various focus distances. Imaging the asymmetric pattern may include leveling the substrate to various levels along an optical axis. In addition or in the alternative, imaging the asymmetric pattern may include utilizing an ultra-violet optical source. Determining the defects may include calculating a difference between the alignment offset and a reference alignment offset. The method may further include measuring the reference alignment offset. The method may further include calibrating focal distance of the lens system. Determining defects of the lens system may include determining stray light caused by the defects of the lens system, using the alignment offset.

The present disclosure also provides a lithography apparatus capable of monitoring lens contamination. The apparatus includes a lens system; a substrate stage configured to secure a substrate for receiving a radiation energy through the lens system, and designed operable to support relative movement between the substrate and the lens system; and a detection system. The detection system is operable to form an asymmetric pattern on the substrate using an imaging source; measure an alignment offset of the asymmetric pattern; calibrate the focus of the lens system using the alignment offset; and determine contamination of the lens system using the alignment offset.

The disclosed apparatus may further include a mask stage operable to secure a mask having the asymmetric pattern. The substrate may include an imaging layer coated thereon. The apparatus may further include an alignment system to detect alignment offset signal. The detection system is operable to form images of the asymmetric pattern in various focus conditions.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for measuring lens contamination in a lithography apparatus, comprising:
    imaging an asymmetric pattern utilizing a lens system;
    measuring an alignment offset of the asymmetric pattern, the alignment offset being associated with the lens system; and
    determining defects of the lens system by comparing the alignment offset to a reference value,
    wherein imaging the asymmetric pattern comprises introducing stray light from defects of the lens system, the stray light narrowing the alignment offset relative to the reference value.

2. The method of claim 1, wherein the defects of the lens system are selected from the group consisting of particles, chemical contamination, physical defects, and combinations thereof.

3. The method of claim 1, further comprising:
    providing a mask having the asymmetric pattern.

4. The method of claim 1, wherein imaging the asymmetric pattern comprises exposing the asymmetric pattern onto a substrate coated with a photosensitive material layer.

5. The method of claim 1, further comprising:
    imaging the asymmetric pattern utilizing a reference lens system that is substantially defect-free; and
    measuring the reference value using the asymmetric pattern from the reference lens system.

6. The method of claim 1, further comprising implementing a focus calibration technique utilizing the asymmetric pattern.

7. A method for measuring lens contamination in a lithography apparatus, comprising:
    providing a mask having an asymmetric pattern utilizable by a focus-calibration-using-alignment (FOCAL) technique;
    imaging the asymmetric pattern to a substrate using a lens system;
    measuring an alignment offset of the asymmetric pattern; and
    identifying defects of the lens system using the alignment offset by comparing the alignment offset to a reference value,
    wherein imaging the asymmetric pattern comprises introducing stray light from defects of the lens system, the stray light narrowing the alignment offset relative to the reference value.

8. The method of claim 7, wherein imaging the asymmetric pattern utilizes an ultra-violet optical source.

9. The method of claim 7, further comprising calibrating focal distance of the lens system.

10. The method of claim 7, wherein determining defects of the lens system comprises identifying a stray light caused by the defects of the lens system, using the alignment offset.

11. The method of claim 7, wherein imaging the asymmetric pattern comprises exposing the asymmetric pattern to the substrate at a plurality of focus distances.

12. The method of claim 7, wherein identifying the defects comprises calculating a difference between the alignment offset and a reference alignment offset.

13. The method of claim 11, wherein imaging the asymmetric pattern comprises leveling the substrate to a plurality of levels along an optical axis.

14. The method of claim 12, further comprising measuring the reference alignment offset.

15. A lithography apparatus, comprising:
    a lens system;
    a substrate stage configured to secure a substrate for receiving a radiation energy through the lens system, and designed operable to support relative movement between the substrate and the lens system; and
    a detection system designed operable to
        form an asymmetric pattern on the substrate using an imaging source;
        measure an alignment offset of the asymmetric pattern;
        calibrate the focus of the lens system using the alignment offset; and
        determine contamination of the lens system by
    determining defects of the lens system by comparing the alignment offset to a reference value,
        wherein operable to form an asymmetric pattern comprises introducing stray light from defects of the lens system, the stray light narrowing the alignment offset relative to the reference value.

16. The apparatus of claim 15, further comprising a mask stage operable to secure a mask having the asymmetric pattern.

17. The apparatus of claim 15, wherein the detection system includes a controller for running a software program for determining the contamination of the lens system.

18. The apparatus of claim 15, wherein the detection system includes a measurement system to detect an alignment offset signal.

19. The method of claim 15, wherein the detection system is operable to form images of the asymmetric pattern in various focus conditions.

* * * * *